(12) United States Patent
Zhai (10) Patent No.: US 10,096,798 B2
(45) Date of Patent: Oct. 9, 2018

(54) FLEXIBLE ORGANIC LIGHT EMITTING DEVICE AND METHOD OF MANUFACTURING THE SAME

(71) Applicant: EverDisplay Optronics (Shanghai) Limited, Shanghai (CN)

(72) Inventor: Baocai Zhai, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 6 days.

(21) Appl. No.: 15/607,834

(22) Filed: May 30, 2017

(65) Prior Publication Data

US 2018/0033999 A1 Feb. 1, 2018

(30) Foreign Application Priority Data

Aug. 1, 2016 (CN) .......................... 2016 1 0624512

(51) Int. Cl.
| | |
|---|---|
| *H01L 51/52* | (2006.01) |
| *H01L 27/32* | (2006.01) |
| *H01L 51/56* | (2006.01) |
| *H01L 51/00* | (2006.01) |

(52) U.S. Cl.
CPC ........ *H01L 51/5253* (2013.01); *H01L 27/323* (2013.01); *H01L 51/5293* (2013.01); *H01L 51/56* (2013.01); *B32B 2255/28* (2013.01); *H01L 51/0097* (2013.01); *H01L 51/5275* (2013.01)

(58) Field of Classification Search
CPC .... H01L 51/56; H01L 51/5253; H01L 27/323
See application file for complete search history.

(56) References Cited

U.S. PATENT DOCUMENTS

2015/0349294 A1* 12/2015 Lee ..................... H01L 51/5246
257/40

* cited by examiner

*Primary Examiner* — Dung Le
(74) *Attorney, Agent, or Firm* — Yunling Ren (57) ABSTRACT

The present disclosure provides a flexible organic light emitting device and a method of manufacturing the same. The flexible organic light emitting device includes: a flexible array substrate; an organic light emitting device layer, formed on a side of the flexible array substrate; an aluminum oxide layer, formed on a side of the organic light emitting device layer away from the flexible array substrate; at least one composite water and oxygen barrier layer, formed on a side of the aluminum oxide layer away from the organic light emitting device layer and including a mica foil and a polymer layer, the mica foil being provided on a side of the polymer layer toward the aluminum oxide layer; and a polarizing layer with a touch electrode, formed on a side of the composite water and oxygen barrier layer away from the aluminum oxide layer.

10 Claims, 6 Drawing Sheets

FLEXIBLE ORGANIC LIGHT EMITTING DEVICE AND METHOD OF MANUFACTURING THE SAME

CROSS-REFERENCE TO RELATED APPLICATIONS

This application is based upon and claims priority to Chinese Patent Application No. 201610624512.4, filed on Aug. 1, 2016, the entire contents thereof are incorporated herein by reference.

TECHNICAL FIELD

The present disclosure relates to the field of OLED (Organic Light-Emitting Diode) panel processing, and more particularly, to a flexible organic light emitting device and a method of manufacturing the same.

BACKGROUND

Nowadays, flexible electronic and flexible display has become a research hotspot in recent years. A flexible display electronic product with a fixed curved surface, which is bendable, foldable or even curly, such as a flexible TFT-LCD (Thin-Film Transistor Liquid Crystal Display), a flexible OLED or the like, has gradually become the most promising high technology industry. Many domestic and foreign mobile phone panel manufacturers have invested heavily in related researches and verifications, competing for flexible electroluminescent (EL) technology and business opportunities.

To improve the performance of FOLED (Flexible Organic Light Emitting Diode) devices, in addition to improving the flatness and smoothness of the substrate material to prevent damage to the light emitting layer of the device due to an uneven surface, it is more important to prevent water and oxygen penetrating into the device through a substrate or an encapsulation layer, resulting in damage to the organic film layer and failure of the device. Therefore, to improve the lifespan of the panel, it is essential to develop structures and materials with excellent performance to block water and oxygen.

The existing OLED packaging technology mainly includes a single-layer/multi-layer film packaging technology, a Barix film packaging technology with organic and inorganic semiconductor material stacked arrangement.

Figure 1:
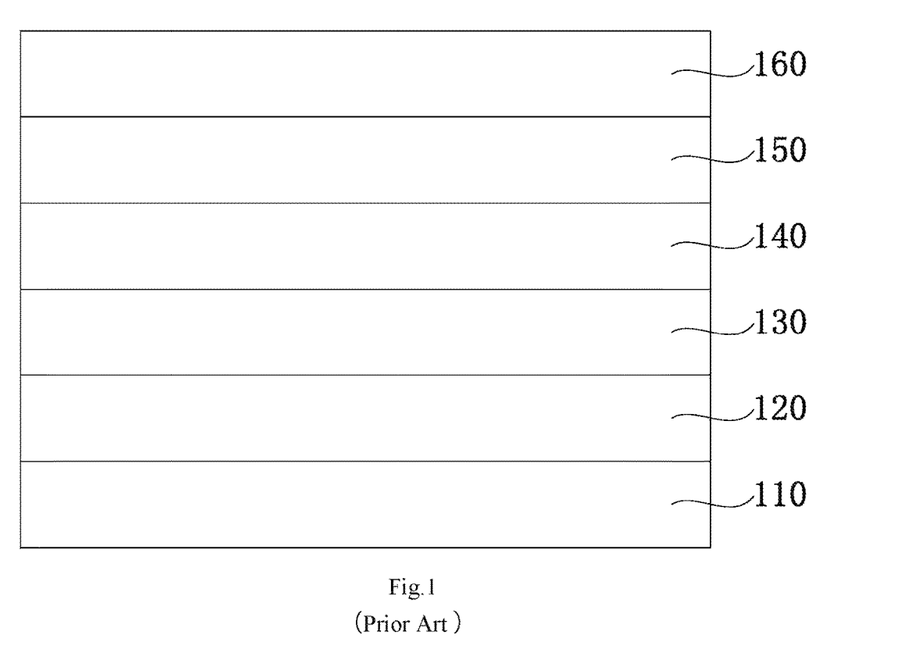
FIG. 1 is a cross-section schematic view of a single-layer/multi-layer film encapsulation in the prior art.

FIG. 1 is a cross-section schematic view of a single-layer/multi-layer film encapsulation in the prior art. As shown in FIG. 1, an existing OLED device encapsulated by a single-layer/multi-layer film includes a flexible array substrate (flexible TFT) 110, an organic light emitting device layer (OLED) 120, a first encapsulation film 130, a second encapsulation film 140, a third encapsulation film 150, and a polarizing layer (TP/POL) 160 with a touch electrode which are sequentially laminated from bottom to top. The existing single-layer/multi-layer film encapsulation mainly utilizes a single-layer/multi-layer $SiO_x/SiN_x$ (silicon oxide/silicon nitride) film to block water and oxygen, and a refractive index of $SiN_x$ (silicon nitride) is 2.02. In this structure, the water blocking effect of the single layer is not obvious, and the device lifespan is only several hundreds of hours. The multi-layer film is prone to cracking.

Figure 2:
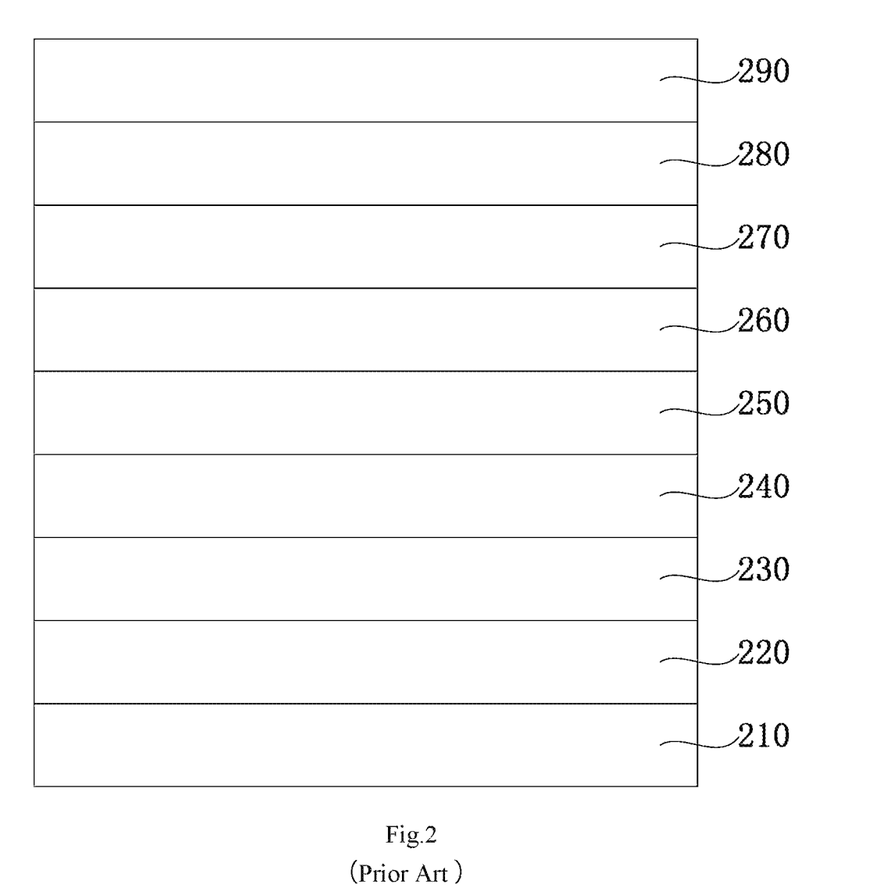
FIG. 2 is a cross-section schematic view of a Barix film encapsulation in the prior art.

FIG. 2 is a cross-section schematic view of the Barix film encapsulation in the prior art. As shown in FIG. 2, an existing OLED device encapsulated by a Barix film includes a flexible array substrate (flexible TFT) 210, an organic light emitting device layer (OLED) 220, a first water and oxygen barrier layer (Barrier Film) 230, a first polymer layer 240, a second water and oxygen barrier layer (Barrier Film) 250, a second polymer layer 260, a third water and oxygen barrier layer (Barrier Film) 270, a third polymer layer 280 and a polarizing layer (TP/POL) 290 with a touch electrode which are sequentially laminated from bottom to top. Among them, the Barix film is a unique film isolation layer, whose effect on the permeability to moisture and oxygen is equivalent to a piece of glass.

Multi-layer organic/inorganic stacked packaging technology is an ideal packaging technology to block water and oxygen, but as for the top-emitting AMOLED (Active-matrix organic light emitting diode) display module, it is easy to aggravate its visual angle color shift phenomenon and reduce the optical taste.

In view of this, the inventors have provided a flexible organic light emitting device and a method of manufacturing the same.

SUMMARY

Aiming at defects existing in the prior art, the present disclosure aims to provide a flexible organic light emitting device and a method of manufacturing the same, which may meet the requirement of blocking water and oxygen, and meanwhile it will not aggravate the visual angle color shift phenomenon of an OLED microcavity device.

According to an aspect of the present disclosure, there is provided a flexible organic light emitting device, including:

a flexible array substrate;

an organic light emitting device layer, formed on a side of the flexible array substrate;

an aluminum oxide layer, formed on a side of the organic light emitting device layer away from the flexible array substrate;

at least one composite water and oxygen barrier layer, formed on a side of the aluminum oxide layer away from the organic light emitting device layer and including a mica foil and a polymer layer, the mica foil being provided on a side of the polymer layer toward the aluminum oxide layer; and a polarizing layer with a touch electrode, formed on a side of the composite water and oxygen barrier layer away from the aluminum oxide layer.

According to an embodiment, the composite water and oxygen barrier layer further includes a silicon oxide layer on a side of the polymer layer away from the aluminum oxide layer.

According to an embodiment, only one layer of the composite water and oxygen barrier layer is provided between the aluminum oxide layer and the polarizing layer, the aluminum oxide layer has a thickness of 90 nm to 110 nm, the mica foil has a thickness of 900 nm to 1100 nm, the polymer layer has a thickness of 2700 nm to 3300 nm, and the silicon oxide layer has a thickness of 180 nm to 220 nm.

According to an embodiment, three laminated layers of the composite water and oxygen barrier layer are provided between the aluminum oxide layer and the polarizing layer, the mica foil in each layer of the composite water and oxygen barrier layer has a thickness of 90 nm to 110 nm, the polymer layer in each layer of the composite water and oxygen barrier layer has a thickness of 900 nm to 1100 nm, and the silicon oxide layer in each layer of the composite water and oxygen barrier layer has a thickness of 700 nm to 900 nm.

According to an embodiment, three laminated layers of the composite water and oxygen barrier layer are provided between the aluminum oxide layer and the polarizing layer, a silicon oxide layer is provided between the polarizing layer and the composite water and oxygen barrier layer, the aluminum oxide layer has a thickness of 90 nm to 110 nm, and the silicon oxide layer has a thickness of 90 nm to 110 nm.

According to an embodiment, the mica foil has a refractive index in a range of 1.5 to 1.65, the polymer layer has a refractive index of 1.5, and the silicon oxide layer has a refractive index of 1.5.

According to another aspect of the present disclosure, there is provided a method of manufacturing a flexible organic light emitting device, including following steps:

S101: providing a flexible array substrate;

S102: forming an organic light emitting device layer on the flexible array substrate;

S103: forming at least one composite water and oxygen barrier layer on the organic light emitting device layer, wherein the step of forming the composite water and oxygen barrier layer includes forming a mica foil and a polymer layer, and the mica foil is provided on a side of the polymer layer toward the aluminum oxide layer; and S104: forming a polarizing layer with a touch electrode on the composite water and oxygen barrier layer.

According to an embodiment, in the step S103, the step of forming the composite water and oxygen barrier layer further includes forming a silicon oxide layer on a side of the polymer layer away from the aluminum oxide layer.

According to an embodiment, three laminated layers of the composite water and oxygen barrier layer are formed between the aluminum oxide layer and the polarizing layer, the mica foil in each layer of the composite water and oxygen barrier layer has a thickness of 90 nm to 110 nm, the polymer layer in each layer of the composite water and oxygen barrier layer has a thickness of 900 nm to 1100 nm, and the silicon oxide layer in each layer of the composite water and oxygen barrier layer has a thickness of 700 nm to 900 nm.

According to an embodiment, in the step S103, three laminated layers of the composite water and oxygen barrier layer are formed between the aluminum oxide layer and the polarizing layer; and after the step S103 and before the step S104, the method further includes forming a silicon oxide layer between the polarizing layer and the composite water and oxygen barrier layer, the aluminum oxide layer having a thickness of 90 nm to 110 nm, and the silicon oxide layer having a thickness of 90 nm to 110 nm.

In view of the above, the flexible organic light emitting device and a method of manufacturing the same provided by the present disclosure may meet the requirement of blocking water and oxygen, and meanwhile it will not aggravate the visual angle color shift phenomenon of an OLED microcavity device.

BRIEF DESCRIPTION OF THE DRAWINGS

Other features, objects and advantages of the present disclosure will become more apparent by reading the following detail descriptions on non-restrictive embodiments with reference to the drawings.

REFERENCE SIGNS

110 Flexible array substrate
120 Organic light emitting device layer
130 First encapsulation film
140 Second encapsulation film
150 Third encapsulation film
160 Polarizing layer with a touch electrode
210 Flexible array substrate
220 Organic light emitting device layer
230 First water and oxygen barrier layer
240 First polymer layer
250 Second water and oxygen barrier layer
260 Second polymer layer
270 Third water and oxygen barrier layer
280 Third polymer layer
290 Polarizing layer with a touch electrode
300 First flexible organic light emitting device
310 Flexible array substrate
320 Organic light emitting device layer
330 Aluminum oxide layer
340 Composite water and oxygen barrier layer
341 Mica foil
342 Polymer layer
342 Silicon oxide layer
350 Polarizing layer with a touch electrode
400 Second flexible organic light emitting device
410 Flexible array substrate
420 Organic light emitting device layer
430 Aluminum oxide layer
440 First composite water and oxygen barrier layer
441 Mica foil
442 Polymer layer
443 Silicon oxide layer
450 Second composite water and oxygen barrier layer
451 Mica foil
451 Polymer layer
453 Silicon oxide layer
460 Third composite water and oxygen barrier layer
461 Mica foil
462 Polymer layer
463 Silicon oxide layer
470 Polarizing layer with a touch electrode
500 Third flexible organic light emitting device
510 Flexible array substrate
520 Organic light emitting device layer
530 Aluminum oxide layer
540 Fourth composite water oxygen barrier layer
541 Mica foil
542 Polymer layer
550 Fifth composite water oxygen barrier layer
551 Mica foil
552 Polymer layer
560 Sixth composite water oxygen barrier layer 561 Mica foil
562 Polymer layer
570 Silicon oxide layer
580 Polarizing layer having a touch electrode

DETAILED DESCRIPTION

The exemplary implementations of the present disclosure will now be described more fully with reference to the accompanying drawings. However, the exemplary implementations can be implemented in various forms and should not be understood as being limited to the implementations set forth herein; instead, these implementations are provided so that this disclosure will be thorough and complete, and the conception of exemplary implementations will be fully conveyed to those skilled in the art. In the drawings, the same reference signs denote the same or similar structures, thus their detailed description will be omitted.

The described features, structures or characteristics may be combined in one or more embodiments in any suitable manner. In the following description, numerous specific details are provided so as to allow a full understanding of the embodiments of the present disclosure. However, those skilled in the art will recognize that the technical solutions of the present disclosure may be practiced without one or more of the specific details; or other methods, components, materials and so on may be used. In other cases, well-known structures, materials or operations are not shown or described in detail to avoid obscuring various aspects of the present disclosure.

Figure 3:
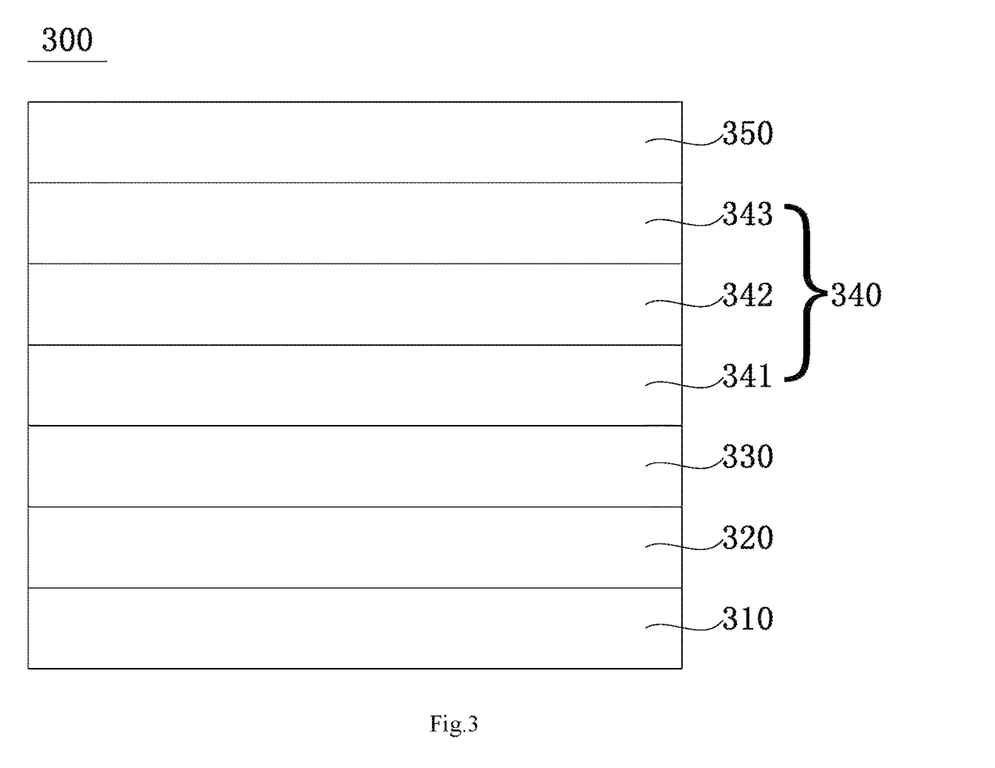
FIG. 3 is a cross-section schematic view of a first flexible organic light emitting device according to the present disclosure.

FIG. 3 is a cross-section schematic view of a first flexible organic light emitting device according to the present disclosure. As shown in FIG. 3, a first flexible organic light emitting device 300 of the present disclosure includes a flexible array substrate 310, an organic light emitting device layer 320, an aluminum oxide layer 330, a composite water and oxygen barrier layer 340 and a polarizing layer 350 with a touch electrode which are sequentially laminated from bottom to top. In an embodiment, the aluminum oxide layer 330, the composite water and oxygen barrier layer 340 and the polarizing layer 350 with the touch electrode are all provided at a light emitting side of the organic light emitting device layer 320.

In the embodiment, the thickness of the aluminum oxide layer is 100 nm, but it is not limited thereto. In a preferred embodiment, the composite water and oxygen barrier layer 340 includes a mica foil 341, a polymer layer 342 and a silicon oxide layer 343 sequentially laminated from bottom to top. The mica foil 341 is located on a side of the polymer layer 342 toward the aluminum oxide layer 330. The mica foil 341 has a thickness of 1000 nm. The polymer layer 342 has a thickness of 3000 nm. The silicon oxide layer 343 has a thickness of 200 nm, but not limited thereto. The refractive index of the organic light emitting device layer 320 is 1.8. The mica foil 341 has a refractive index in a range of 1.5 to 1.65. The polymer layer 342 has a refractive index of 1.5. The silicon oxide layer 343 has a refractive index of 1.5. The refractive index of the polarizing layer 350 is 1.5. In another variation example, the composite water and oxygen barrier layer only includes the mica foil and the polymer layer sequentially laminated from bottom to top, without the silicon oxide layer.

Since the mica foil 341 has a high transmittance, its thickness may be tens of nanometers, the surface has high flatness and smoothness, high tolerance temperature, small thermal expansion coefficient, and strong flexibility requirement, which may be used in flexible display. The most important is that the water and oxygen barrier property is in the same level with that of a glass. In the present embodiment, the refractive index of the mica foil ranges from 1.5 to 1.65, which matches with the refractive index of other films. In view of the fact that the refractive index of the mica foil is lower than that (n=2.02) of the silicon nitride of the OLED structure in the prior art, the structure of the flexible organic light emitting device in FIG. 3 may suppress the optical interference effect of the multi-layer encapsulation structure, to avoid aggravating the visual angle color shift phenomenon of an OLED microcavity display module.

Figure 4:
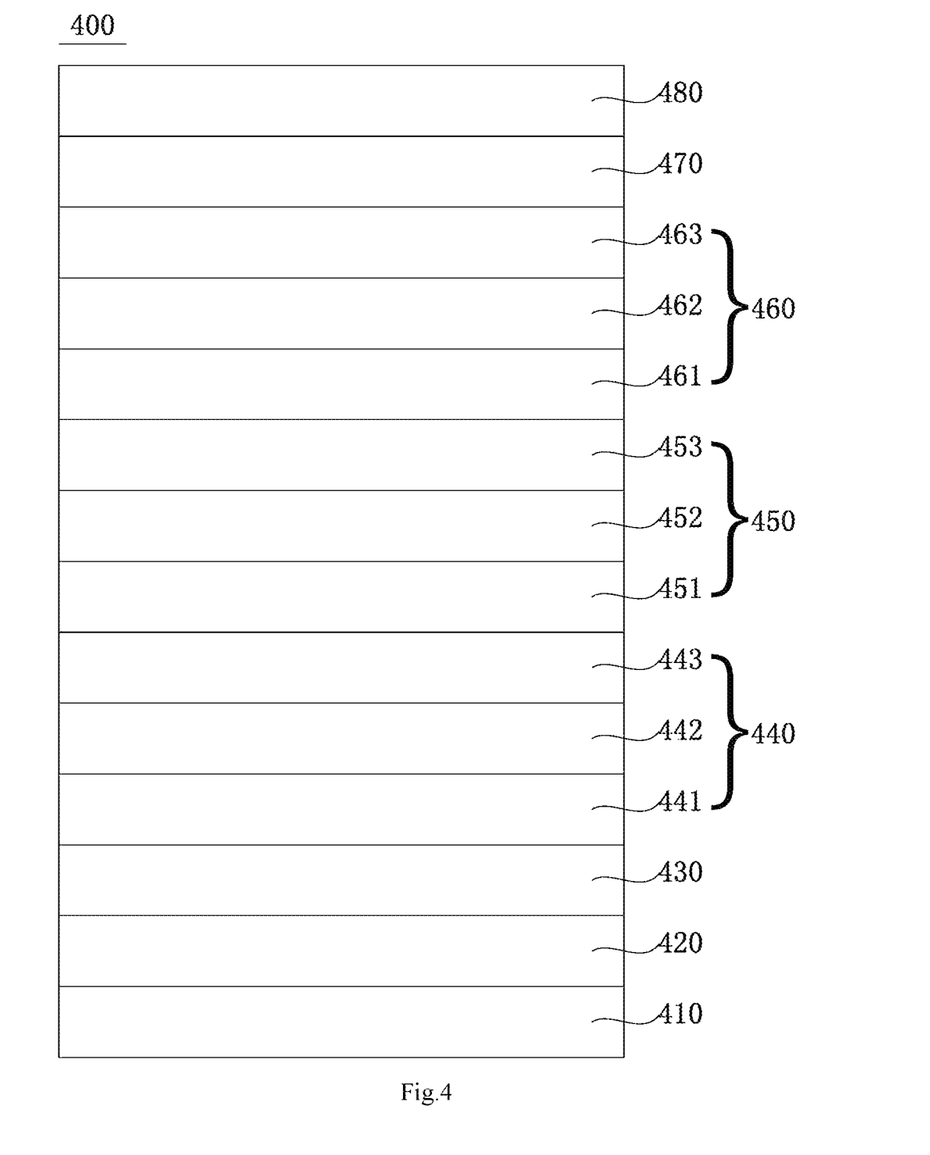
FIG. 4 is a cross-section schematic view of a second flexible organic light emitting device according to the present disclosure.

FIG. 4 is a cross-section schematic view of a second flexible organic light emitting device according to the present disclosure. As shown in FIG. 4, on the basis of the first flexible organic light emitting device 300, by providing the stacked arrangement of multiple laminated layers of the composite water and oxygen barrier layer, the second flexible organic light emitting device 400 according to the present disclosure may obtain a higher level of water and oxygen shielding capability, and the water and oxygen barrier effect of the encapsulation may be improved by controlling the thickness of respective layers in the composite water and oxygen barrier layer. The second flexible organic light emitting device 400 of the present disclosure includes a flexible array substrate 410, an organic light emitting device layer 420, an aluminum oxide layer 430, a first composite water and oxygen barrier layer 440, a second composite water and oxygen barrier layer 450, a third composite water and oxygen barrier layer 460, and a polarizing layer 470 with a touch electrode which are sequentially laminated from bottom to top.

In an embodiment, the first composite water and oxygen barrier layer 440 includes a mica foil 441, a polymer layer 442 and a silicon oxide layer 443 which are sequentially laminated from bottom to top. The mica foil 441 has a thickness of 100 nm. The polymer layer 442 has a thickness of 1000 nm. The silicon oxide layer 443 has a thickness of 800 nm, but not limited thereto.

The second composite water and oxygen barrier layer 450 includes a mica foil 451, a polymer layer 452 and a silicon oxide layer 453 which are sequentially laminated from bottom to top. The mica foil 451 has a thickness of 100 nm. The polymer layer 452 has a thickness of 1000 nm. The silicon oxide layer 453 has a thickness of 800 nm, but not limited thereto.

The third composite water and oxygen barrier layer 460 includes a mica foil 461, a polymer layer 462 and a silicon oxide layer 463 which are sequentially laminated from bottom to top. The mica foil 461 has a thickness of 100 nm. The polymer layer 462 has a thickness of 1000 nm. The silicon oxide layer 463 has a thickness of 800 nm, but not limited thereto.

Obviously, the multi-layer structure (having a structure of a plurality layers of laminated mica foils) of the composite water and oxygen barrier layer in the second flexible organic light emitting device 400 may achieve a better water and oxygen barrier effect than the structure as shown in FIG. 3.

Figure 5:
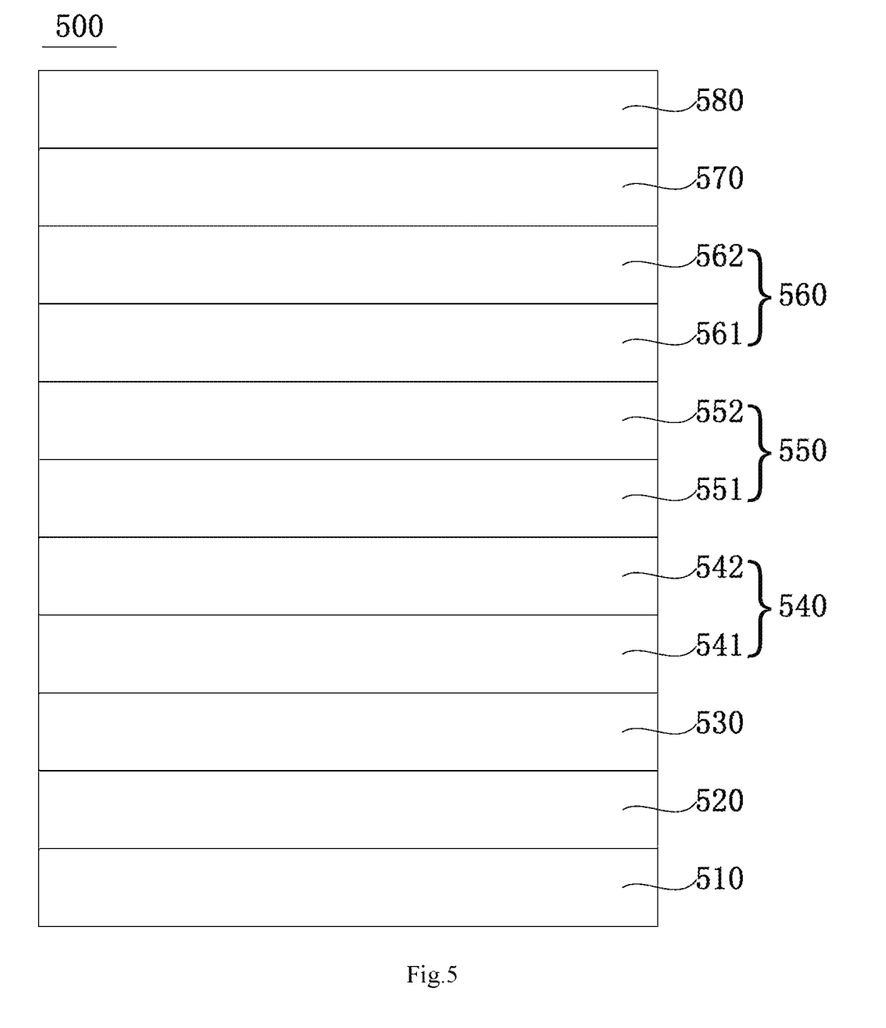
FIG. 5 is a cross-section schematic view of a third flexible organic light emitting device according to the present disclosure.

FIG. 5 is a cross-section schematic view of a third flexible organic light emitting device according to the present disclosure. As shown in FIG. 5, the third flexible organic light emitting device 500 of the present disclosure provides another multi-layer laminated structure of the composite water and oxygen barrier layer 340. The third flexible organic light emitting device 500 of the present disclosure includes a flexible array substrate 510, an organic light emitting device layer 520, an aluminum oxide layer 530, a fourth composite water and oxygen barrier layer 540, a fifth composite water and oxygen barrier layer 550, a sixth composite water and oxygen barrier layer 560, and a silicon oxide layer 570 and a polarizing layer 580 with a touch electrode which are sequentially laminated from bottom to top. In an embodiment, the aluminum oxide layer 530 has a thickness of 100 nm, and the silicon oxide layer 570 has a thickness of 100 nm. The fourth composite water and oxygen barrier layer 540 includes a mica foil 541 and a polymer layer 542 which are sequentially laminated from bottom to top. The fifth composite water and oxygen barrier layer 550 includes a mica foil 551 and a polymer layer 552 which are sequentially laminated from bottom to top. The sixth composite water and oxygen barrier layer 560 includes a mica foil 561 and a polymer layer 562 which are sequentially laminated from bottom to top. The multi-layer structure (also having a plurality of laminated layers of mica foil structures) of the composite water and oxygen barrier layer in the third flexible organic light emitting device may also achieve a better water and oxygen barrier effect.

Figure 6:
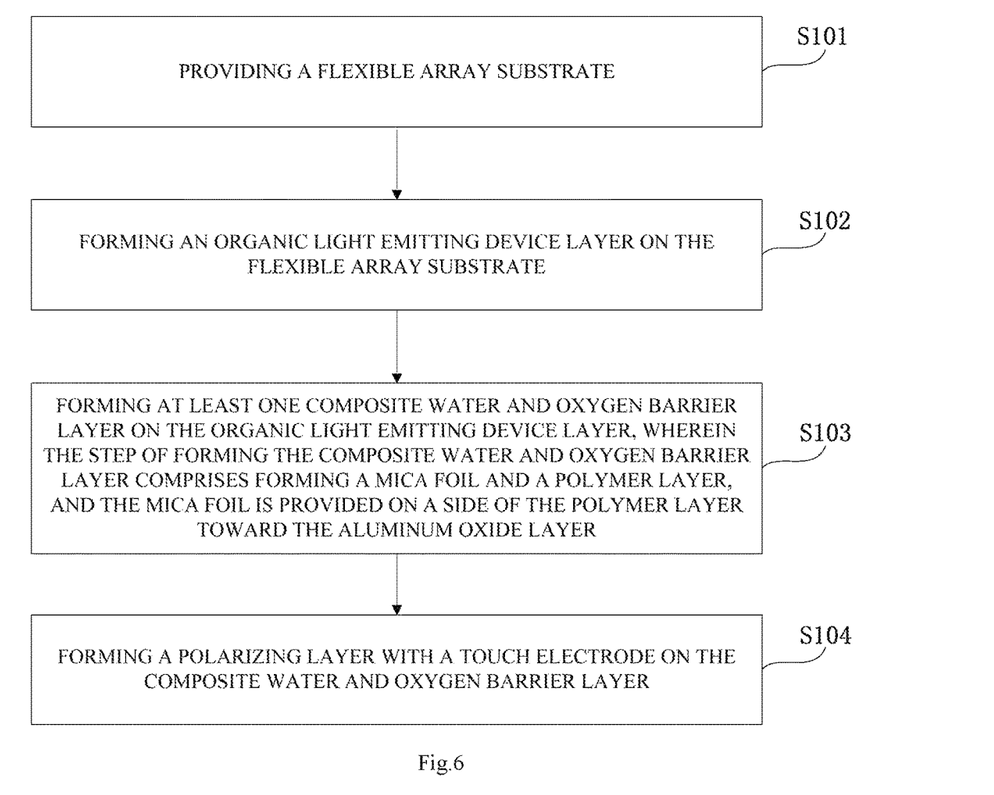
FIG. 6 is a flow chart of a method of manufacturing a flexible organic light emitting device according to the present disclosure.

FIG. 6 is a flow chart of a method of manufacturing a flexible organic light emitting device according to the present disclosure. As shown in FIG. 6, the method of manufacturing a flexible organic light emitting device of the present disclosure is used to manufacture the above flexible organic light emitting device, including following steps:

S101: providing a flexible array substrate;

S102: forming an organic light emitting device layer on the flexible array substrate;

S103: forming at least one composite water and oxygen barrier layer on the organic light emitting device layer, wherein the step of forming the composite water and oxygen barrier layer includes forming a mica foil and a polymer layer, and the mica foil is provided on a side of the polymer layer toward the aluminum oxide layer; and S104: forming a polarizing layer with a touch electrode on the composite water and oxygen barrier layer.

In a variation example, in the step S103, the step of forming the composite water and oxygen barrier layer further includes forming a silicon oxide layer on a side of the polymer layer away from the aluminum oxide layer. Three laminated layers of the composite water and oxygen barrier layer are formed between the aluminum oxide layer and the polarizing layer, the mica foil in each layer of the composite water and oxygen barrier layer has a thickness of 100 nm, the polymer layer in each layer of the composite water and oxygen barrier layer has a thickness of 1000 nm, and the silicon oxide layer in each layer of the composite water and oxygen barrier layer has a thickness of 800 nm.

In another variation example, in the step S103, three laminated layers of the composite water and oxygen barrier layer are formed between the aluminum oxide layer and the polarizing layer; and after the step S103 and before the step S104, the method further includes forming a silicon oxide layer between the polarizing layer and the composite water and oxygen barrier layer, the aluminum oxide layer having a thickness of 100 nm, and the silicon oxide layer having a thickness of 100 nm.

The flexible organic light emitting device of the present disclosure provides a novel structure by combining three kinds of materials, i.e., a mica foil belonging to an inorganic layer, a polymer layer and a silicon oxide layer, the refractive index of the mica foil is lower than that (n=2.02) of the silicon nitride in the prior art, such that the present disclosure may suppress the optical interference effect of the multi-layer encapsulation structure, to avoid aggravating the visual angle color shift phenomenon of an OLED microcavity display module.

Accordingly, the flexible organic light emitting device and the method of manufacturing the same according to the present disclosure may reduce the thickness of the flexible organic light emitting device and its manufacturing method, and integrate the touch function into the flexible organic light emitting device and its manufacturing method, which improves the added value of the flexible organic light emitting device and its manufacturing method.

Hereinabove, particular embodiments of the present disclosure have been described. It should be appreciated that the present disclosure is not limited to the above particular implementations, and various variations and modifications are possible to those skilled in the art without departing from the scope of the claims, which do not affect the substance of the present disclosure.

What is claimed is:

1. A flexible organic light emitting device, comprising:
a flexible array substrate;
an organic light emitting device layer, formed on a side of the flexible array substrate;
an aluminum oxide layer, formed on a side of the organic light emitting device layer away from the flexible array substrate;
at least one composite water and oxygen barrier layer, formed on a side of the aluminum oxide layer away from the organic light emitting device layer and comprising a mica foil and a polymer layer, the mica foil being provided on a side of the polymer layer toward the aluminum oxide layer; and
a polarizing layer with a touch electrode, formed on a side of the composite water and oxygen barrier layer away from the aluminum oxide layer.

2. The flexible organic light emitting device according to claim 1, wherein the composite water and oxygen barrier layer further comprises a silicon oxide layer on a side of the polymer layer away from the aluminum oxide layer.

3. The flexible organic light emitting device according to claim 2, wherein only one layer of the composite water and oxygen barrier layer is provided between the aluminum oxide layer and the polarizing layer, the aluminum oxide layer has a thickness of 90nm to 110nm, the mica foil has a thickness of 900nm to 1100nm, the polymer layer has a thickness of 2700nm to 3300nm, and the silicon oxide layer has a thickness of 180nm to 220nm.

4. The flexible organic light emitting device according to claim 2, wherein three laminated layers of the composite water and oxygen barrier layer are provided between the aluminum oxide layer and the polarizing layer, the mica foil in each layer of the composite water and oxygen barrier layer has a thickness of 90nm to 110nm, the polymer layer in each layer of the composite water and oxygen barrier layer has a thickness of 900nm to 1100nm, and the silicon oxide layer in each layer of the composite water and oxygen barrier layer has a thickness of 700nm to 900nm.

5. The flexible organic light emitting device according to claim 1, wherein three laminated layers of the composite water and oxygen barrier layer are provided between the aluminum oxide layer and the polarizing layer, a silicon oxide layer is provided between the polarizing layer and the composite water and oxygen barrier layer, the aluminum oxide layer has a thickness of 90nm to 110nm, and the silicon oxide layer has a thickness of 90nm to 110nm.

6. The flexible organic light emitting device according to claim 2, wherein the mica foil has a refractive index in a range of 1.5 to 1.65, the polymer layer has a refractive index of 1.5, and the silicon oxide layer has a refractive index of 1.5.

7. A method of manufacturing a flexible organic light emitting device, comprising following steps:
- S101: providing a flexible array substrate;
- S102: forming an organic light emitting device layer on the flexible array substrate, wherein an aluminum oxide layer is formed on a side of the organic light emitting device layer away from the flexible array substrate;
- S103: forming at least one composite water and oxygen barrier layer on the organic light emitting device layer, wherein the step of forming the composite water and oxygen barrier layer comprises forming a mica foil and a polymer layer, and the mica foil is provided on a side of the polymer layer toward the aluminum oxide layer; and
- S104: forming a polarizing layer with a touch electrode on the composite water and oxygen barrier layer.

8. The method of manufacturing a flexible organic light emitting device according to claim 7, wherein in the step S103, the step of forming the composite water and oxygen barrier layer further comprises forming a silicon oxide layer on a side of the polymer layer away from the aluminum oxide layer.

9. The method of manufacturing a flexible organic light emitting device according to claim 8, wherein three laminated layers of the composite water and oxygen barrier layer are formed between the aluminum oxide layer and the polarizing layer, the mica foil in each layer of the composite water and oxygen barrier layer has a thickness of 90nm to 110nm, the polymer layer in each layer of the composite water and oxygen barrier layer has a thickness of 900nm to 1100nm, and the silicon oxide layer in each layer of the composite water and oxygen barrier layer has a thickness of 700nm to 900nm.

10. The method of manufacturing a flexible organic light emitting device according to claim 7, wherein in the step S103, three laminated layers of the composite water and oxygen barrier layer are formed between the aluminum oxide layer and the polarizing layer; and
- after the step S103 and before the step S104, the method further comprises forming a silicon oxide layer between the polarizing layer and the composite water and oxygen barrier layer, the aluminum oxide layer having a thickness of 90nm to 110nm, and the silicon oxide layer having a thickness of 90nm to 110nm.

* * * * *